(12) United States Patent
Ohri et al.

(10) Patent No.: US 9,024,361 B2
(45) Date of Patent: May 5, 2015

(54) SOLID-STATE IMAGING DEVICE AND METHOD OF MANUFACTURING SOLID-STATE IMAGING DEVICE

(75) Inventors: Hiroyuki Ohri, Kanagawa (JP); Yasunori Sogoh, Kanagawa (JP)

(73) Assignee: Sony Corporation, Tokyo (JP)

( * ) Notice: Subject to any disclaimer, the term of this patent is extended or adjusted under 35 U.S.C. 154(b) by 784 days.

(21) Appl. No.: 12/838,517

(22) Filed: Jul. 19, 2010

(65) Prior Publication Data
US 2011/0018037 A1    Jan. 27, 2011

(30) Foreign Application Priority Data

Jul. 27, 2009 (JP) ................. 2009-174329
Mar. 19, 2010 (JP) ................. 2010-065114

(51) Int. Cl.
| | | |
|---|---|---|
| *H01L 27/148* | (2006.01) | |
| *H01L 21/00* | (2006.01) | |
| *H01L 27/146* | (2006.01) | |

(52) U.S. Cl.
CPC .... *H01L 27/14609* (2013.01); *H01L 27/14689* (2013.01)

(58) Field of Classification Search
USPC ........................................................ 257/222
See application file for complete search history.

(56) References Cited

U.S. PATENT DOCUMENTS

| | | | | |
|---|---|---|---|---|
| 6,690,423 | B1* | 2/2004 | Nakamura et al. | 348/311 |
| 2003/0228736 | A1* | 12/2003 | Kimura | 438/286 |
| 2004/0178430 | A1* | 9/2004 | Rhodes et al. | 257/292 |
| 2008/0035957 | A1* | 2/2008 | Park et al. | 257/204 |

FOREIGN PATENT DOCUMENTS

| | | |
|---|---|---|
| JP | 2001-028433 | 1/2001 |
| JP | 2006-066481 | 3/2006 |
| JP | 2006-191236 | 7/2006 |
| JP | 2006-311515 | 11/2006 |
| JP | 2007-053217 | 3/2007 |
| JP | 2007-329479 | 12/2007 |
| JP | 2009-049870 | 3/2009 |

OTHER PUBLICATIONS

Japanese Patent Office; Office Action dated Jan. 21, 2014 for Serial No. 2010-065114.

* cited by examiner

*Primary Examiner* — Yasser A Abdelaziez
*Assistant Examiner* — Cory Eskridge
(74) *Attorney, Agent, or Firm* — Dentons US LLP

(57) ABSTRACT

Provided is a solid-state imaging device including: a photodiode which converts an optical signal to signal charges; a transfer gate which transfers the signal charges from the photodiode; an impurity diffusion layer to which the signal charges are transferred by the transfer gate; and a MOS transistor of which a gate is connected to the impurity diffusion layer. The impurity diffusion layer has a first conduction type semiconductor layer and a second conduction type semiconductor layer which is formed in the first conduction type semiconductor layer and under an end portion of the transfer gate.

11 Claims, 12 Drawing Sheets

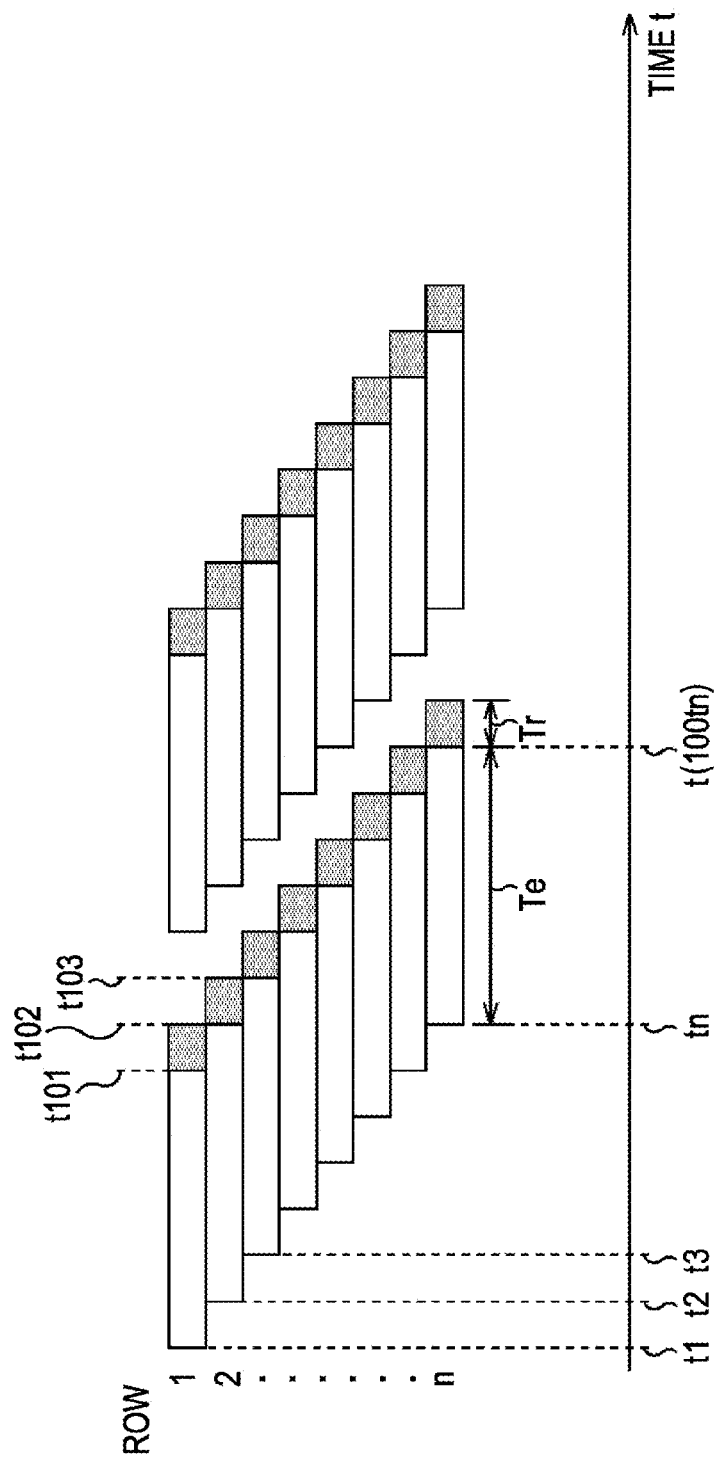

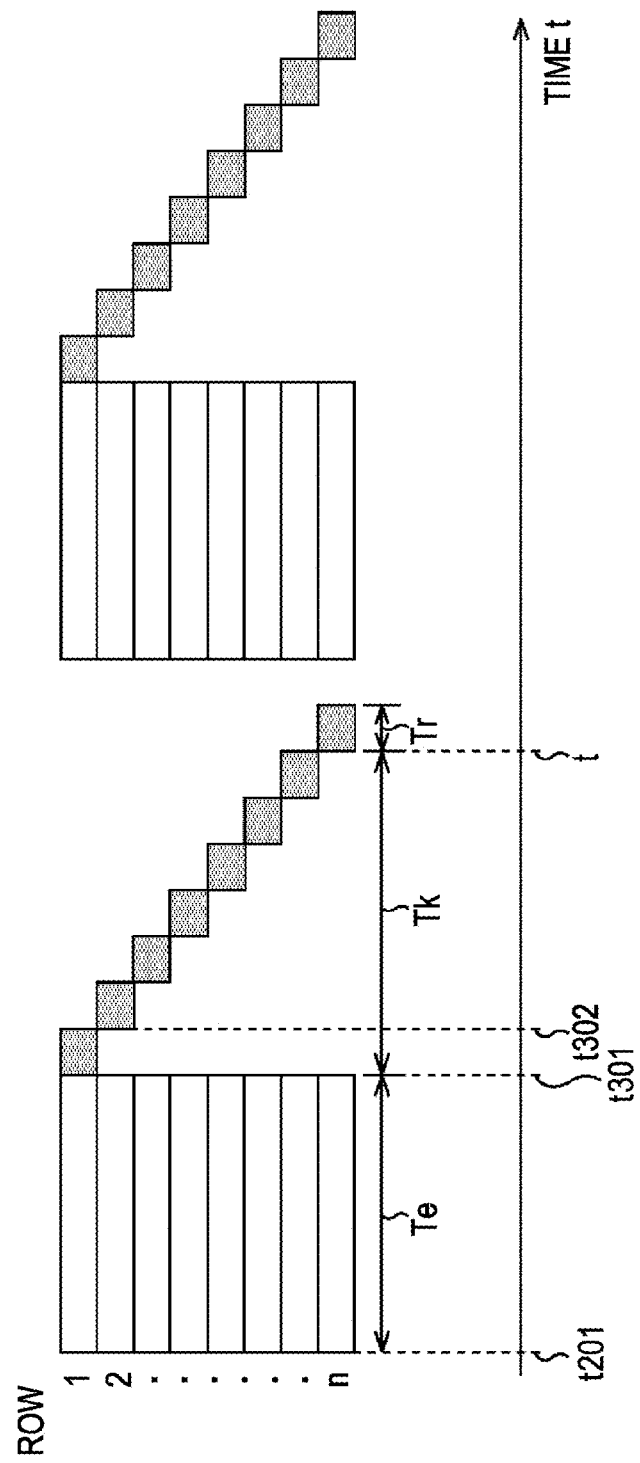

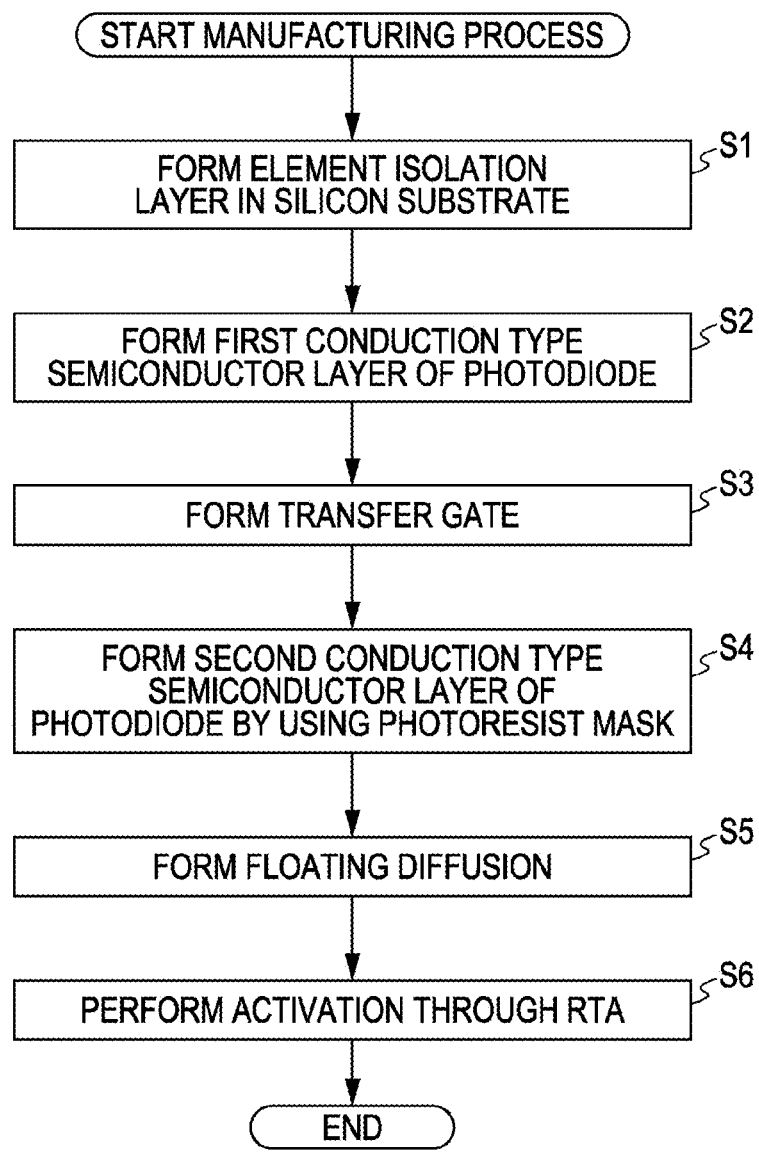

SOLID-STATE IMAGING DEVICE AND METHOD OF MANUFACTURING SOLID-STATE IMAGING DEVICE

BACKGROUND OF THE INVENTION

1. Field of the Invention

The present invention relates to a solid-state imaging device and a method of manufacturing the solid-state imaging device, and more particularly, to a solid-state imaging device capable of suppressing a leak current of a CMOS (complementary metal oxide semiconductor) type solid-state imaging device constructed with a semiconductor and reducing noise at a low luminance time or dark time, and method of manufacturing the solid-state imaging device.

2. Description of the Related Art

A CMOS (complementary metal oxide semiconductor) type solid-state imaging device (hereinafter, sometimes referred to as a CMOS type imaging device) may be driven at a low voltage level and may easily satisfy a requirement of a high pixel density in terms of power consumption and a requirement of a high reading speed.

Recently, due to these characteristics, the CMOS type image capturing devices have been used in digital single lens reflex cameras necessitating a high image quality and a professional image capturing apparatuses as well as small-sized personal apparatuses such as mobile phones attached with cameras. In addition, the CMOS type image capturing device has been attracted attention as a high performance image capturing device that is a substitute for a CCD (charge coupled device) of the related art.

In the related art, it is said that in the image capturing device, noise may be easily introduced in an image at a dark time or a low luminance time. Due to the unfavorable result of the comparison with a silver salt camera, some users have refused to use the image capturing devices. Therefore, noise reduction in the image capturing device has become an issue.

Therefore, a technology for reducing noise by suppressing a leak current at a dark time of a low luminance time in photodiodes and floating diffusions included in the CMOS type image capturing device has been considered to be important.

FIG. 1 illustrates an example of a configuration of a CMOS type image capturing device including a floating diffusion in the related art. In general, the floating diffusion FD is disposed opposite to a photodiode PD with a transfer gate TG for transferring charges interposed therebetween, which is constructed with Poly-Si (polysilicon) or the like. An impurity diffusion layer having the same conduction type as that of the photodiode PD is formed at the position where a transfer gate TG for transferring charges is interposed (refer to Japanese Unexamined Patent Application Publication No. 2001-028433).

Among the CMOS type image capturing devices, in a CMOS type image capturing device having the rolling shutter scheme, the floating diffusion is used as a signal charge reading element. On the other hand, in a CMOS type image capturing device having the global shutter scheme, the floating diffusion is used as an element of storing the signal charges until the reading is performed in addition to the reading element (refer to Japanese Unexamined Patent Application Publication No. 2006-311515).

Now, the rolling shutter scheme and the global shutter scheme are described.

The CMOS type image capturing devices may be classified into two types, the rolling shutter scheme (sometimes referred to as a focal plane shutter scheme or a line exposure scheme) and the global shutter scheme according to a difference of a concurrency in an accumulation time interval (or an exposure time interval) of signal charges photo-electrically converted by the photodiodes (refer to Japanese Unexamined Patent Application Publication No. 2006-191236).

The rolling shutter scheme denotes a scheme where pixels outputting signals perform photoelectric conversion from the time of outputting the signals and perform accumulation of signal charges in a photodiode until the reading is sequentially performed. In this scheme, accumulation time intervals for the signal charges are different according to the rows in the pixel array. Therefore, deformation exists in the captured image.

On the other hand, the global shutter scheme denotes a scheme of sustaining concurrency of the accumulation time intervals for the signal charges in order to remove the deformation caused by the rolling shutter scheme. In order to implement the global shutter scheme, there have been proposed a method of additionally using a mechanical shutter (refer to Japanese Unexamined Patent Application Publication No. 2006-191236), a method of sustaining concurrency of the accumulation time intervals by performing the transfer of signal charges from photodiodes simultaneously at all pixels in a floating diffusion covered by a light shielding layer and storing the signal charges until the reading is performed (refer to Japanese Unexamined Patent Application Publication No. 2009-049870) and the like.

In the structure of the CMOS type image capturing device shown in FIG. 1 in the related art, Japanese Unexamined Patent Application Publication No. 2001-028433 discloses that crystal defect is easily introduced in an end portion of a transfer gate TG formed by anisotropic etching with respect to Poly-Si (polysilicon) or the like. In the off state of the transfer gate TG, due to a voltage difference between the floating diffusion FD and the transfer gate TG, the electric field concentration occurs in the vicinity of the end portion of the transfer gate TG where the crystal defect is easily generated. As a result, a leak current is generated through the crystal defect at the site of the electric field concentration, so that aliasing signals may be output at a dark time or a low luminance time.

In addition, in FIG. 1, an n type impurity diffusion layer n1 is disposed as a first conduction type semiconductor layer on a silicon substrate Si, and a p type impurity diffusion layer p1 is disposed as a second conduction type semiconductor layer thereon. The photodiode PD is constructed with the layers p1 and n1. In addition, in the figure, an element isolation region DV is disposed, and under the element isolation region DV, a p type impurity diffusion layer p2 is disposed. In addition, an n type impurity diffusion layer n2 is disposed opposite to the photodiode PD with the transfer gate TG interposed therebetween, so that the floating diffusion FD is formed.

More specifically, in general, in a semiconductor apparatus, according to a mechanism called a Trap-Assisted-Tunneling (TAT) model, it is described that, if electric field concentration occurs in a crystal defect portion due to a reverse bias of a pn junction, a leak current is generated through the crystal defect. In addition, it is widely known that the aforementioned problem occurs due to the similar mechanism (refer to Hurkx et al., "A New Recombination Model for Device Simulation Including Tunneling" (IEEE TED. Vol. 39, no. 2, pp. 331-338, 1992) and G. Eneman et al., "Analysis of junction leakage in advanced germanium P+/n junctions" (in Proc. European Solid-State Device Research Conf. 2007, pp. 454-457)).

FIGS. 2A and 2B illustrate simulation results of an impurity concentration distribution and an electric field strength distribution of the floating diffusion region in the CMOS type image capturing device in the related art. FIG. 2A illustrates the impurity concentration distribution, and FIG. 2B illustrates the electric field strength distribution. In the impurity concentration distribution of FIG. 2A, as the color is closer to white, the concentration of the n type impurities is higher; and as the color is closer to black, the concentration of the p type impurities is higher. In addition, in the electric field strength distribution of FIG. 2B, as the color is closer to white, the electric field strength is higher; and as the as the color is closer to black, the electric field strength is lower. In addition, FIGS. 2A and 2B illustrate the case where the transfer gate TG exists and the floating diffusion FD is disposed in the figures. In other words, FIGS. 2A and 2B illustrate the distributions in the enlarged range of the vicinities of the transfer gate TG and the floating diffusion FD of FIG. 1. In FIG. 2B, an off time of the transfer gate TG is assumed, and thus, a negative voltage is applied to the transfer gate TG, so that the floating diffusion FD region is at a positive voltage.

In other words, in the case of a structure shown in FIGS. 2A and 2B in the related art, at the off time of the transfer gate TG, a negative voltage is applied to the transfer gate TG, so that the voltage may be transferred through a gate insulating layer to an inner portion of the silicon substrate Si just under the gate insulating layer. As a result, due to a voltage difference between the silicon substrate just under the gate insulating layer and the floating diffusion FD region, there exists an area (area A in FIG. 2B) in the vicinity of the end portion of the transfer gate TG, where the electric field has the maximum value.

Particularly, in the global shutter scheme CMOS type image capturing device, in the case where signal charges are stored in the floating diffusion FD in an example such as Japanese Unexamined Patent Application Publication No. 2006-311515, the influence of the leak current is inevitable. In other words, during the signal charge storing time interval, since the leak current is continuously generated in the floating diffusion FD due to the aforementioned mechanism, noises occur in the to-be-transferred signal charges, so that an SN ratio (signal to noise ratio) deteriorates.

Therefore, it is preferable to obtain a structure of reducing the leak current by implementing a structure of allowing no electric field concentration to occur in an area such as an end portion of the transfer gate TG where the crystal defect is easily generated.

SUMMARY OF THE INVENTION

It is desirable to provide a solid-state imaging device capable of preventing electric field concentration in the vicinity of an end portion of a transfer gate in a floating diffusion of a CMOS type solid-state imaging device, so that a leak current is not easily generated and a method of manufacturing the solid-state imaging device.

In a first embodiment of the invention, there is provided a solid-state imaging device including: a photodiode which converts an optical signal to signal charges; a transfer gate which transfers the signal charges from the photodiode; an impurity diffusion layer to which the signal charges are transferred by the transfer gate; and a MOS transistor of which a gate is connected to the impurity diffusion layer, wherein the impurity diffusion layer has a first conduction type semiconductor layer and a second conduction type semiconductor layer which is formed in the first conduction type semiconductor layer and under an end portion of the transfer gate.

In the above embodiment, the first conduction type semiconductor layer and the second conduction type semiconductor layer may be formed to be partially in contact with each other.

In addition, a portion constructed with the second conduction type semiconductor layer may be connected to the second conduction type semiconductor layer which is formed around an element isolation region of the first conduction type semiconductor layer.

In addition, the second conduction type semiconductor layer may be formed under an end portion of a reset gate and in a source region, which is connected to the impurity diffusion layer, of a reset transistor.

In addition, in the case where a plurality of impurity diffusion layers and a plurality of transfer gates are included in one pixel, the second conduction type semiconductor layer may be formed under the end portion of the transfer gate in the first conduction type semiconductor layer where at least one or more impurity diffusion layers are formed.

In addition, in the case where the plurality of impurity diffusion layers and the plurality of transfer gates are included in one pixel, in the at least one or more impurity diffusion layers interposed between the transfer gates, a surface of the first conduction type semiconductor layer may be covered with the second conduction type semiconductor layer.

In addition, the solid-state imaging device may be a solid-state imaging device having a global shutter function of allowing all the pixels to simultaneously perform image capturing operations, and all the pixels may simultaneously perform the transfer of signal charges from the photodiodes to the impurity diffusion layers, so that the signal charges are stored in the impurity diffusion layers during a time interval from the transferring to the reading.

In a second embodiment of the invention, there is provided a method of manufacturing a solid-state imaging device including the steps of: forming a first conduction type semiconductor layer constituting a photodiode on a silicon substrate; forming a transfer gate; forming a second conduction type semiconductor layer under an end portion of the transfer gate; and forming a first conduction type semiconductor layer constituting an impurity diffusion layer.

In a third embodiment of the invention, there is provided an electronic apparatus employing a solid-state imaging device which includes: a photodiode which converts an optical signal to signal charges; a transfer gate which transfers the signal charges from the photodiode; an impurity diffusion layer to which the signal charges are transferred by the transfer gate; and a MOS transistor of which a gate is connected to the impurity diffusion layer, wherein the impurity diffusion layer has a first conduction type semiconductor layer and a second conduction type semiconductor layer which is formed in the first conduction type semiconductor layer and under an end portion of the transfer gate.

In the first embodiment of the invention, the optical signal is converted to the signal charges by the photodiode; the signal charges are transferred from the photodiode to the impurity diffusion layer by the transfer gate; the signal charges are transferred to the impurity diffusion layer; the gate of the MOS transistor is connected to the impurity diffusion layer by the MOS transistor; and the second conduction type semiconductor layer is formed under the end portion of the transfer gate of the first conduction type semiconductor layer where the impurity diffusion layer is formed.

In the second embodiment of the invention, the first conduction type semiconductor layer constituting the photodiode is formed on the silicon substrate; the transfer gate which transfers the signal charges to the impurity diffusion layer is formed; the second conduction type semiconductor layer is formed under the end portion of the transfer gate; and the first conduction type semiconductor layer constituting the impurity diffusion layer is formed.

According to an embodiment of the invention, in a floating diffusion, the electric field concentration in the vicinity of the end portion of the transfer gate TG where the crystal defect is easily generated is prevented, so that it is possible to suppress the leak current. In addition, since a structure where the impurity diffusion layer constituting the floating diffusion does not overlap the transfer gate TG is implemented, the overlap capacitance under the end portion of the transfer gate is reduced, so that the conversion efficiency is increased. As a result, it is possible to capture an image at a high SN ratio.

BRIEF DESCRIPTION OF THE DRAWING

FIG. 6 is a diagram illustrating operations of a rolling shutter.

FIG. 7 is a diagram illustrating operations of a global shutter.

FIG. 8 is a flowchart illustrating a manufacturing method.

DESCRIPTION OF THE PREFERRED EMBODIMENTS

Hereinafter, exemplary embodiments of the invention (hereinafter, referred to as embodiments) are described. The description proceeds according to the following order.
1. First Embodiment (basic example)
2. Second Embodiment (example where element isolation region is surrounded by second conduction type semiconductor layer)
3. Third Embodiment (example where floating diffusion is connected to source region of reset transistor)
4. Fourth Embodiment (example where a plurality of transfer gates and a plurality of floating diffusions are included)

First Embodiment

[Configuration of One Pixel Circuit Including Solid-State Imaging Device]

A configuration of a solid-state imaging device according to the invention is described. First, a configuration of one pixel circuit including the solid-state imaging device is described.

Figure 3:
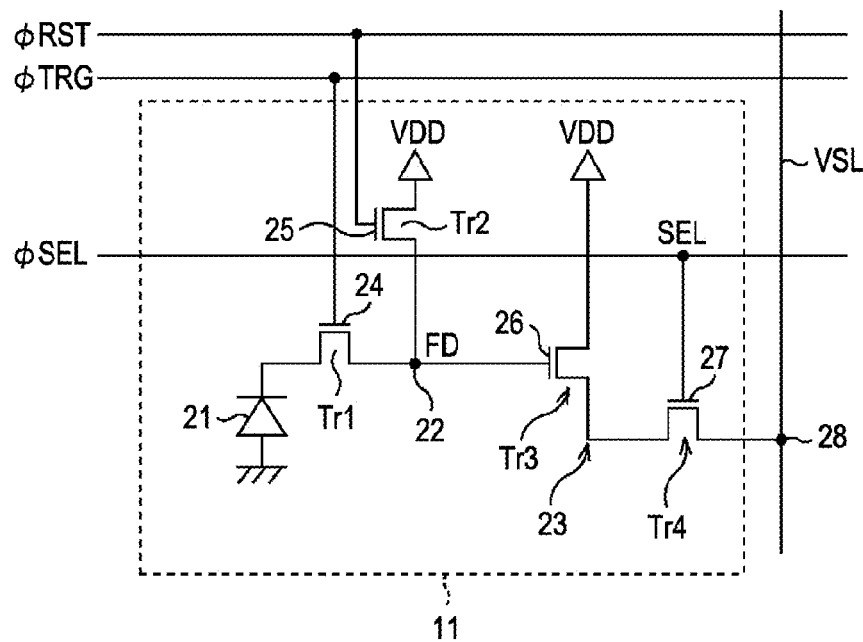
FIG. 3 is a diagram illustrating a configuration of one pixel circuit including a solid-state imaging device.

FIG. 3 illustrates the configuration of one pixel circuit including the solid-state imaging device. As shown in FIG. 3, one pixel circuit including the solid-state imaging device is configured to include a photodiode 21, a floating diffusion portion (FD) 22, and a plurality of MOS transistors Tr1 to Tr4. In FIG. 3, the plurality of the MOS transistors Tr1 to Tr4 includes a transfer transistor Tr1, a reset transistor Tr2, an amplifier transistor Tr3, and a selection transistor Tr4.

The transfer transistor Tr1 is configured with a source constructed with the photodiode 21, and a drain constructed with the floating diffusion portion 22, and a gate electrode 24 formed between the source and the drain. A transfer pulse φTRG is supplied to the gate electrode 24 of the transfer transistor Tr1. Accordingly, the signal charges accumulated in a light sensing portion 21 are transferred to the floating diffusion portion 22. The light sensing portion 21 is the later-described photodiode PD.

The amplifier transistor Tr3 is configured with a source constructed with a power supply voltage VDD, and a drain constructed with an impurity region 23, and a gate electrode 26 formed between the source and the drain.

The floating diffusion portion 22 and the gate electrode 26 of the amplifier transistor Tr3 may have to be electrically connected to each other. In other words, the floating diffusion portion 22 and the gate electrode 26 of the amplifier transistor Tr3 are electrically connected to each other, so that the voltage of the floating diffusion portion 22 is supplied to the gate electrode 26 of the amplifier transistor Tr3. Accordingly, the pixel signal corresponding to the voltage of the floating diffusion portion 22 is output to the impurity region 23 that is the drain of the amplifier transistor Tr3.

The reset transistor Tr2 is configured with a source constructed with the floating diffusion portion 22, a drain constructed with the power supply voltage VDD, and a gate electrode 25 formed between the source and the drain. A reset pulse φRST is supplied to the gate electrode 25 of the reset transistor Tr2. Accordingly, the voltage of the floating diffusion portion 22 is reset to a voltage close to the power source voltage of the power supply voltage VDD.

The selection transistor Tr4 is configured with a source constructed with an impurity region 23, a drain constructed with an impurity region 28 connected to a vertical signal line VSL, and a gate electrode 27 formed between the source and the drain. The impurity region 23 that is the source of the selection transistor Tr4 is commonly used as the drain of the amplifier transistor Tr3. A selection pulse φSEL is supplied to the gate electrode 27 of the selection transistor Tr4. Accordingly, the pixel signal flown to the impurity region 23 is transferred through the vertical signal line VSL.

In FIG. 3, although the floating diffusion portion is exemplarily disposed at one position, the floating diffusion portions may be disposed at a plurality of positions.
[Example of Configuration of Solid-State Imaging Device]

Figure 4:
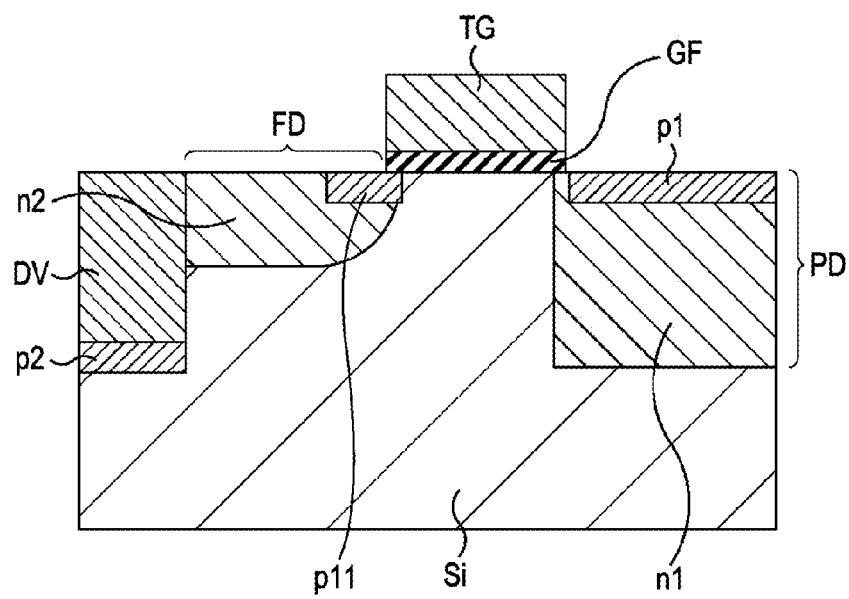
FIG. 4 is a diagram illustrating an example of a configuration of a solid-state imaging device according to an embodiment of the invention.

FIG. 4 illustrates an example of a configuration of a solid-state imaging device according to an embodiment of the invention.

In the solid-state imaging device, an n type impurity diffusion layer n1 is disposed as a first conduction type semiconductor layer on a silicon substrate Si, and a p type impurity diffusion layer p1 is disposed as a second conduction type semiconductor layer thereon. A photodiode PD is constructed with the layers p1 and n1. In addition, in the figure, an element isolation region DV is disposed, and under the element isolation region DV, a p type impurity diffusion layer p2 is disposed. In addition, a transfer gate TG is disposed on a gate insulating layer GF. In addition, an n type impurity diffusion layer n2 that is a first conduction type semiconductor layer is disposed opposite to the photodiode PD with the transfer gate TG interposed therebetween, so that a floating diffusion FD is formed. A p type impurity diffusion layer p11 is disposed as a second conduction type semiconductor layer in an end portion of the transfer gate TG of the n type impurity diffusion layer n2 with which the floating diffusion FD is constructed. More specifically, the p type impurity diffusion layer p11 is formed so that a portion of a surface thereof overlaps the end portion of the transfer gate TG.

[Impurity Concentration Distribution and Electric Field Strength Distribution of Solid-State Imaging Device of FIG. 4]

Figure 5A:
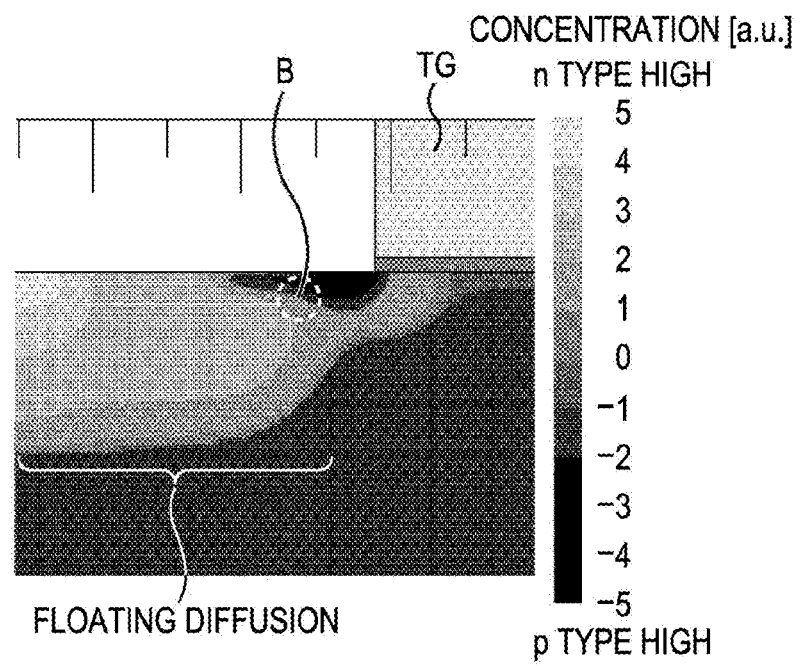
FIGS. 5A and 5B are diagrams illustrating an impurity concentration distribution and an electric field strength distribution in the solid-state imaging device of FIG. 4.
Figure 5B:
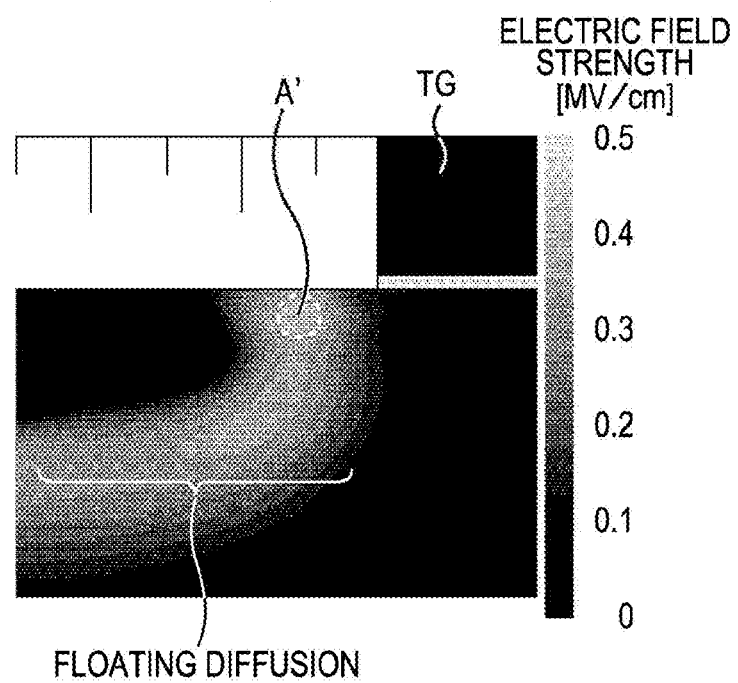

Since the p type impurity diffusion layer p11 is formed, as shown in FIG. 5B, it is possible to suppress the electric field concentration occurring at the end portion of the transfer gate TG of the floating diffusion FD. FIG. 5A illustrates the impurity concentration distribution of the solid-state imaging device of FIG. 4 according to the embodiment of the invention, and FIG. 5B illustrates the electric field strength distribution thereof. In FIG. 5B, an off time of the transfer gate TG is assumed, and thus, a negative voltage is applied to the transfer gate TG, so that the floating diffusion FD region is at a positive voltage. In the impurity concentration distribution of FIG. 5A, as the color is closer to white, the concentration of the n type impurities is higher; and as the color is closer to black, the concentration of the p type impurities is higher. In addition, in the electric field strength distribution of FIG. 5B, as the color is closer to white, the electric field strength is higher; and as the as the color is closer to black, the electric field strength is lower. In addition, FIGS. 5A and 5B illustrate the case where the transfer gate TG exists and the floating diffusion FD is disposed in the figures. In other words, FIGS. 5A and 5B illustrate the distributions in the enlarged range of the vicinities of the transfer gate TG and the floating diffusion FD of FIG. 4.

Figure 1:
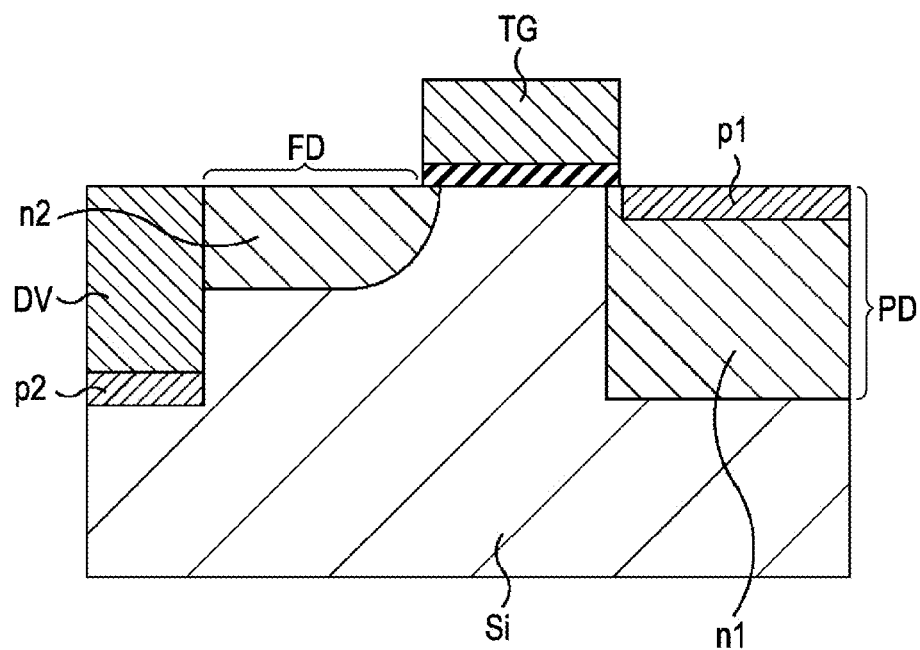
FIG. 1 is a diagram illustrating an example of a configuration of a solid-state imaging device in the related art.

The structure of the solid-state imaging device according to the embodiment of the invention shown in FIG. 4 is different from the structure of the solid-state imaging device in the related art shown in FIG. 1 in terms of the presence or absence of the p type impurity diffusion layer p11.

Figure 2A:
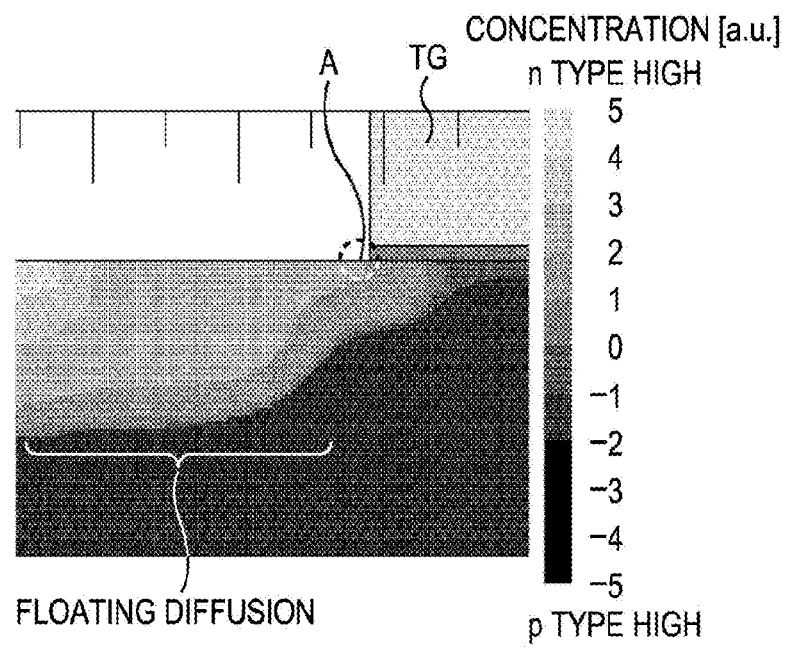
FIGS. 2A and 2B are diagrams illustrating an impurity concentration distribution and an electric field strength distribution in the solid-state imaging device of FIG. 1.
Figure 2B:
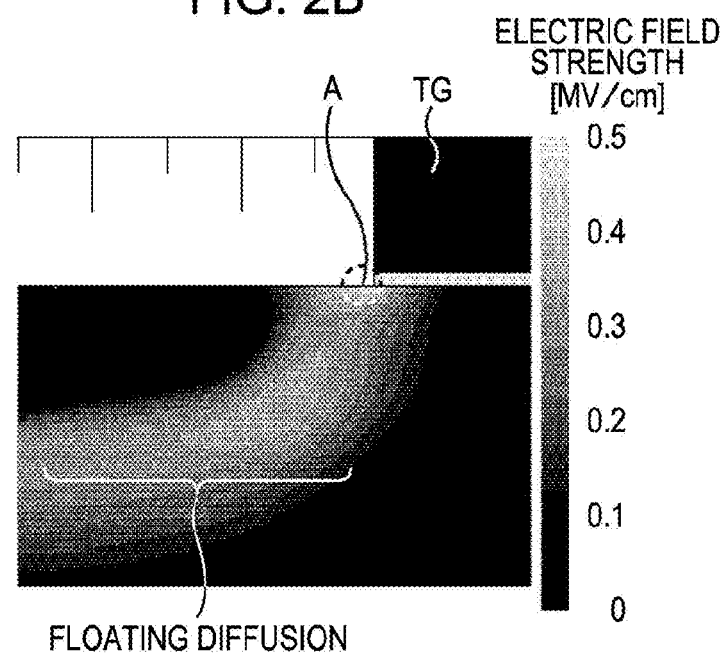

The simulation results of FIGS. 2A and 2B in the solid-state imaging device in the related art shown in FIG. 1 may be described as follows. The negative voltage applied at the off time of the transfer gate TG is transferred to a channel portion in the silicon substrate Si through a gate insulating layer GF, and a voltage difference occurs between the channel portion and the floating diffusion FD. As a result, a site having a maximum value of the electric field is formed in the vicinity of the end portion of the transfer gate TG.

As shown in FIG. 4, the p type impurity diffusion layer p11 (a black portion of the area B of FIG. 5A) is disposed in the vicinity of the end portion of the transfer gate TG of the n type impurity diffusion layer n2. As a result, a pn junction is shifted to an area A' of FIG. 5B in a separation direction from the transfer gate TG to the floating diffusion FD. In other words, as shown in FIG. 5B, the electric field concentration in the end portion of the transfer gate TG is suppressed.

According to the configuration of the embodiment of the invention shown in FIG. 4, it is possible to suppress the electric field concentration in the end portion of the transfer gate TG where a crystal defect may be easily generated and to suppress the occurrence of the leak current due to the crystal defect. In addition, in the configuration of the embodiment of the invention, the n type impurity diffusion layer n2 with which the floating diffusion is constructed does not overlap the transfer gate TG. As a result, an overlap capacitance generated between the transfer gate TG and the n type impurity diffusion layer n2 is decreased in comparison with the case of the structure in the related art shown in FIG. 1. In this manner, since a parasitic capacitance of the floating diffusion is decreased, conversion efficiency is increased. The embodiment of the invention has the aforementioned configuration, so that it is possible to reduce the noise that is easily generated in the capturing at the dark time or the low luminance time.

In addition, particularly, in the global shutter scheme CMOS type image capturing device, it is possible to reduce the noise during the signal charge storing time interval.

[Rolling Shutter Scheme]

For example, in a rolling shutter scheme (referred to as a focal plane shutter scheme or a line exposure scheme), as shown in FIG. 6, the exposure of the photodiode starts in units of a row, and reading starts at the same time of the end of exposure. In other words, in FIG. 6, in the first row, the exposure starts at a time point t1. At a time point t101 when an exposure time interval Te elapses, if the exposure ends, a reading time interval Tr starts. In the second row, the exposure starts at a time point t2. At a time point t102 when the exposure time interval Te elapses, if the exposure ends, the reading time interval Tr starts. The exposure starts at a time point t3. At a time point t103 when the exposure time interval Te elapses, if the exposure ends, the reading time interval Tr starts. Next, in the first row, the exposure starts again at a time point t103. When the exposure time interval Te elapses, the exposure ends, and at the same time, the reading time interval Tr starts. These processes are sequentially repeated. Therefore, in the rolling shutter scheme, with respect to the captured image, since the exposure time intervals are shifted in units of a row, the images of the different timings are captured in units of a row. Therefore, if the one sheet of image is constructed by combining the images in units of a row, distortion may easily occur. However, in the rolling shutter scheme, since there is no signal charge storing time interval, the noise due to the leak current is relatively unlikely to occur.

[Global Shutter Scheme]

On the other hand, in the global shutter scheme, as shown in FIG. 7, the exposure starts simultaneously in all of the rows. When the exposure time interval Te ends, the reading is performed sequentially in units of a row. In other words, in FIG. 7, at a time point t201, the exposure of the photodiodes of all of the rows starts simultaneously. At a time point t301 when the exposure time interval Te ends, the exposure ends simultaneously, and the signal charges are sequentially read in the reading time interval Tr in units of a row. As a result, rows close to the initial row ends in a short time interval approximate to a storing time interval Tk1, but the interval of rows close to the final row lasts for a long time approximate to a storing time interval Tkn. In addition, "n" in Tkn denotes a row number.

Therefore, in the solid-state imaging device in the related art shown in FIG. 1, the electric field concentration occurs on the end portion of the transfer gate TG, so that the leak current is generated. In this state, if the storing time interval Tkn continuously proceeds, the noise is accumulated in the signal charges in proportion to the storing time interval Tkn, so that the image quality may deteriorate.

On the contrary, in the solid-state imaging device according to the embodiment of the invention shown in FIG. 4 the p type impurity diffusion layer p11 is disposed in the vicinity of the end portion of the transfer gate TG of the n type impurity diffusion layer n2, so that it is possible to prevent the electric field concentration in the end portion of the transfer gate TG. As a result, regarding the solid-state imaging device according to the embodiment of the invention shown in FIG. 4, in the shutter scheme such as a global shutter scheme including pixels having a long storing time interval Tkn, the occurrence of the leak current is suppressed, so that the noise is effectively reduced.

[Method of Manufacturing Solid-State Imaging Device of FIG. 4]

Next, a method of manufacturing the solid-state imaging device shown in FIG. 4 is described with reference to a flowchart shown in FIG. 8.

Figure 9A:
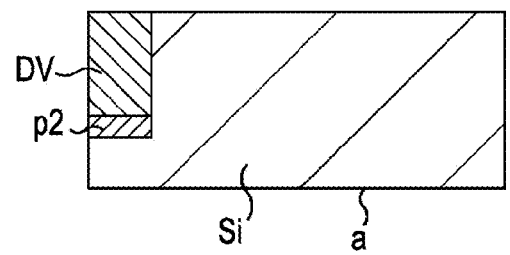
FIGS. 9A to 9E are manufacturing process diagrams illustrating a manufacturing method according to an embodiment of the invention.

In Step S1, as shown in FIG. 9A, the element isolation region DV is formed on the silicon substrate Si. A method of forming the element isolation region DV may be, for example, any one of a LOCOS (local oxidation of silicon) method using selective oxidation of the silicon substrate Si, an STI (shallow trench isolation) method of burying a shallow trench in an insulating layer, and an impurity isolation method of forming a p type impurity diffusion layer in the element isolation region DV. In the case where the element isolation region DV is formed by the LOCOS method or the STI method, before the formation or after the formation, a p type impurity diffusion layer p2 for a channel stopper is formed under the element isolation region DV.

Figure 9B:
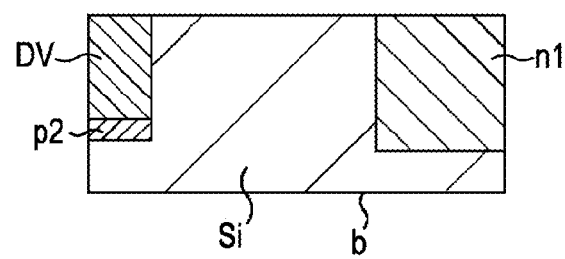

In Step S2, as shown in FIG. 9B, an n type impurity diffusion layer n1 that is a first conduction type semiconductor layer constituting a photodiode PD is formed by performing ion injection.

Figure 9C:
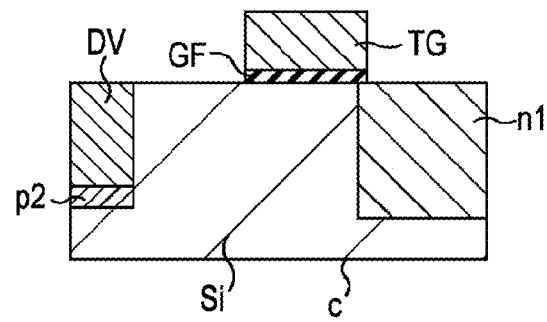

In Step S3, as shown in FIG. 9C, a gate insulating layer GF is formed, and a transfer gate TG constructed with polysilicon (poly-Si) or the like is formed thereon.

Figure 9D:
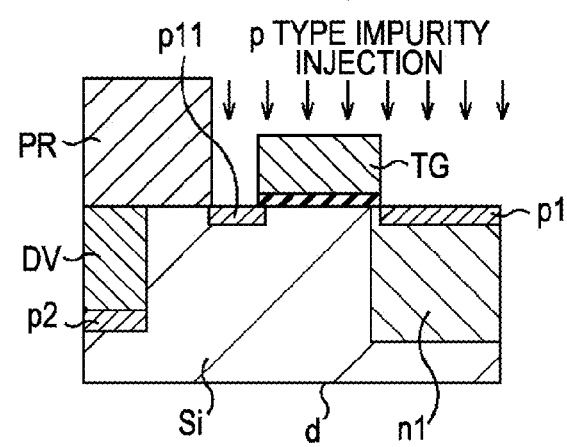

In Step S4, as shown in FIG. 9D, B (boron) ions or $BF_2$ (boron fluoride) ions are injected on a surface of the first conduction type semiconductor layer n1 where the photodiode PD is formed by using photoresist PR as a mask. At the same time, the B ions or the $BF_2$ ions are also injected in a region where the floating diffusion FD is to be formed. As a result, the p type impurity diffusion layer p1 that is the second conduction type semiconductor layer is formed on the surface of the photodiode PD, and at the same time, the second conduction type semiconductor layer p11 is formed in the vicinity of the end portion of the transfer gate TG of the floating diffusion FD in a manner of self-aligning with the transfer gate TG.

In the process, in the case where B (boron) is used as a type of the injected ion, injection energy is set to, for example, 20 keV or less. In the case where $BF_2$ is used, the injection energy is set to, for example, 50 keV or less. In addition, in any one of the cases, the injected amount is set to $1e^{12}/cm^2$ or more.

Figure 9E:
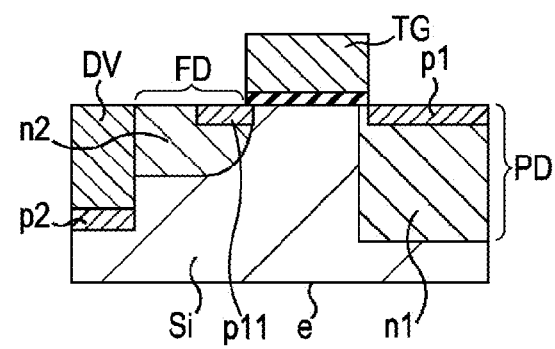

In Step S5, as shown in FIG. 9E, phosphorus ions or arsenic ions of $1e^{13}/cm^2$ or more are injected in the floating diffusion FD, so that an n type impurity diffusion layer n2 that is the first conduction type semiconductor layer is formed.

In Step S6, the injected impurities are activated through thermal treatment such as RTA (rapid thermal annealing).

In the above manufacturing process, the method of forming the first conduction type semiconductor layer of the floating diffusion FD may also be a method of forming a sidewall spacer on a sidewall of the transfer gate TG and, after that, forming a diffusion layer through injection of arsenic or phosphorus as impurities.

In addition, after the transfer gate TG is formed, phosphorus or arsenic of about $1e^{13}/cm^2$ to $1e^{14}/cm^2$ may be injected as impurities, and after that, the sidewall spacer may be formed on the sidewall of the transfer gate TG. In addition, the impurity diffusion layer is formed through injection of the arsenic or phosphorus as impurities, and an LDD (lightly doped drain) structure may be formed.

According to the above manufacturing process, the p type impurity diffusion layer p11 that is the second conduction type semiconductor layer and the p type impurity diffusion layer p1 that is the second conduction type semiconductor layer on the surface of the photodiode PD are simultaneously formed in the vicinity of the end portion of the transfer gate TG of the floating diffusion FD. Therefore, in the manufacturing process in the related art, in the process of forming the p type impurity diffusion layer p1 that is the second conduction type semiconductor layer on the surface of the photodiode PD, the process range is partially enlarged so as to form the layer p11, so that it is possible to manufacture the solid-state imaging device shown in FIG. 4. As a result, unlike the manufacturing process in the related art, it is possible to manufacture the solid-state imaging device capable of easily reducing the leak current at a low cost without the addition of a new process.

Second Embodiment

[Example of Configuration where Element Isolation Region is Surrounded by Second Conduction Type Semiconductor Layer]

Figure 10A:
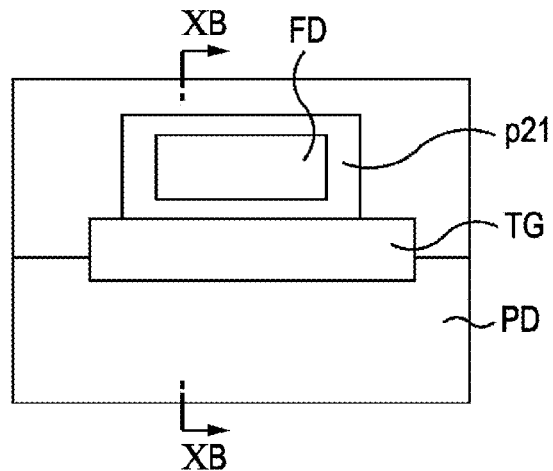
FIGS. 10A and 10B are diagrams illustrating an example of a configuration of a solid-state imaging device according to an embodiment of the invention, in which an element isolation region is surrounded by a second conduction type semiconductor layer.
Figure 10B:
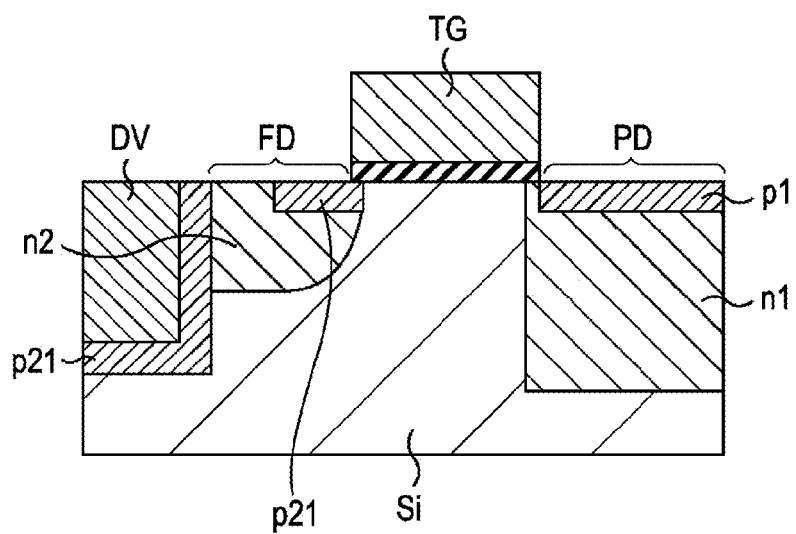

In the above description, the example where the layer p11 as the second conduction type semiconductor layer is formed in the end portion of the transfer gate TG of the floating diffusion FD is described. If the above positional relationship is maintained, the layer p11 may be configured to exist in a different range. For example, as shown in FIGS. 10A and 10B, a layer p21 may be formed instead of the layer p11. The layer p21 is configured to surround the floating diffusion FD at the surface thereof, and to surround the element isolation region DV in a laminated shape. FIG. 10A is a plan view, and FIG. 10B is a cross-sectional view taken along line XB-XB of FIG. 10A.

The layer p21 may be implemented before or after the formation of the element isolation region DV by forming the p type impurity diffusion layer so as to cover the element isolation region DV in the laminated shape through the impurity injection.

According to the configuration, it is possible to prevent the electric field concentration in the end portion of the transfer gate TG where the crystal defect may be easily generated and to reduce the leak current in the floating diffusion FD, and it is also possible to reduce the leak current occurring in the vicinity of the element isolation region DV. As a result, since the leak current may be reduced in any of the transfer gate TG and the element isolation region DV, it is also possible to reduce the noise in the image captured at a dark time or a low luminance time.

Third Embodiment

[Example of Configuration where Floating Diffusion is Connected to Source Region of Reset Transistor]

In the above description, an example where, in the floating diffusion FD, the layer p11 or the layer p21 is formed in the vicinity of the end portion of the transfer gate TG where the crystal defect is easily generated is exemplified. However, even for a portion that is not the end portion of the transfer gate TG, if the crystal defect is easily generated in the portion, the same effect may be obtained.

Figure 11:
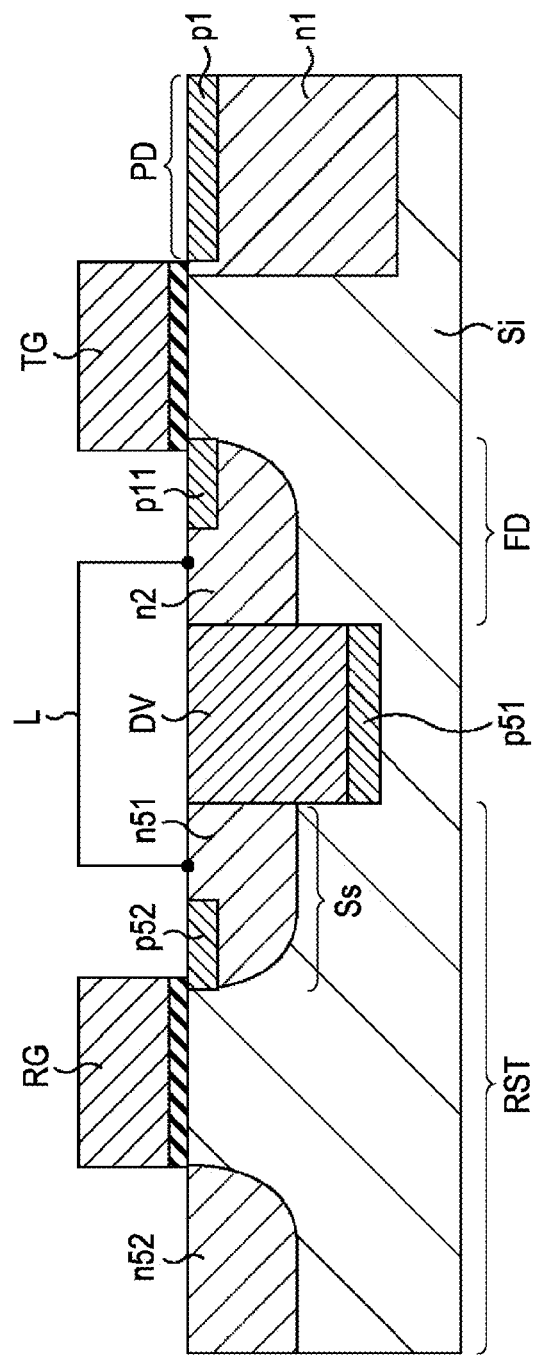
FIG. 11 is a diagram illustrating an example of a configuration of a solid-state imaging device according to an embodiment of the invention, in which a floating diffusion is connected to a source region of a reset transistor.

For example, as shown in FIG. 11, in addition to the transfer gate TG, a reset transistor RST including a reset gate RG may be formed, and a p type impurity diffusion layer p53 that is a second conduction type semiconductor layer similarly to the layer p11 may be formed in a source region Ss of the reset transistor RST connected to the floating diffusion FD.

In this case, the n type impurity diffusion layer n2 constituting the floating diffusion FD and the n type impurity diffusion layer n51 constituting the source region Ss of the reset transistor RST are allowed to be at the same voltage level by a wire line L. If the layers n2 and n51 are integrally formed, the wire line L is unnecessary.

According to the configuration, the electric field concentration occurring in the end portion of the transfer gate TG of the floating diffusion FD may be prevented, so that not only is it possible to reduce the leak current in the floating diffusion FD, but also is it possible to reduce the leak current in the same way in the source region of the reset transistor RST connected to the floating diffusion FD.

Fourth Embodiment

[Example of Configuration where a Plurality of Transfer Gates and Floating Diffusions are Connected]

In the above description, one transfer gate and one floating diffusion are provided, or one reset gate and one source region are provided. However, a plurality of these elements may be configured to be provided.

Figure 12A:
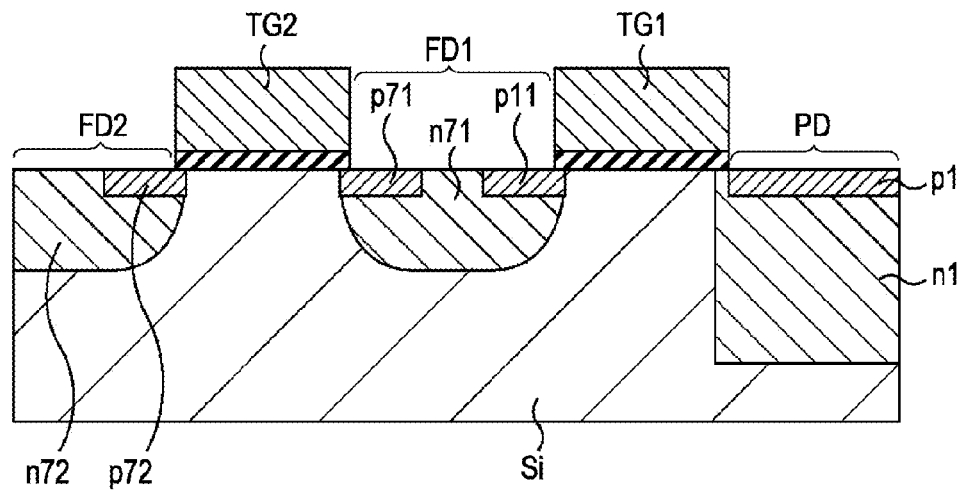
FIGS. 12A and 12B are diagrams illustrating an example of a configuration of a solid-state imaging device according to an embodiment of the invention, in which a plurality of transfer gates and a plurality of floating diffusions are included.

For example, as shown in FIG. 12A, a solid-state imaging device is configured to include two floating diffusions FD1 and FD2 and two transfer gates TG1 and TG2, and p type impurity diffusion layers p11, p71, and p72 that are second conduction type semiconductor layers are disposed on the end portion of each of the transfer gates TG1 and TG2 of the floating diffusions FD1 and FD2. In other words, the p type impurity diffusion layers p11, p71, and p72 are disposed on the end portions of the transfer gates TG1 and TG2 of the layers n71 and 72 that are first conduction type semiconductor layers constituting the floating diffusions FD1 and FD2. Therefore, in any one thereof, since the electric field concentration in the end portion of the transfer gate where the crystal defect is easily generated may be prevented, it is possible to reduce the leak current caused by the electric field concentration.

Figure 12B:
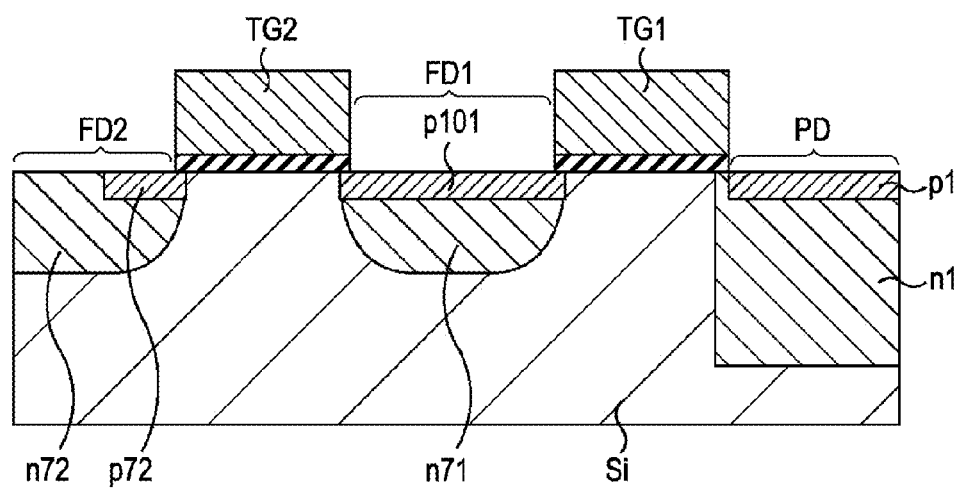

In addition, the layers p11 and p71 may be configured integrally to surround the layer n71 at the surface thereof. More specifically, as shown in FIG. 12B, the layers p11 and p71 may be formed integrally to constitute a layer p101 so as to cover the surface of the layer n71, so that the same effect may be obtained.

In addition, in the above description, the first conduction type semiconductor layer and the second conduction type semiconductor layer correspond to the n type impurity diffusion layer and the p type impurity diffusion layer, respectively. However, the p type impurity diffusion layer and the n type impurity diffusion layer may be configured to be exchanged. In this case, the same effect is also obtained.

[Example of Configuration of Electronic Apparatus Employing Solid-State Imaging Device According to the Embodiment of the Invention]

Figure 13A:
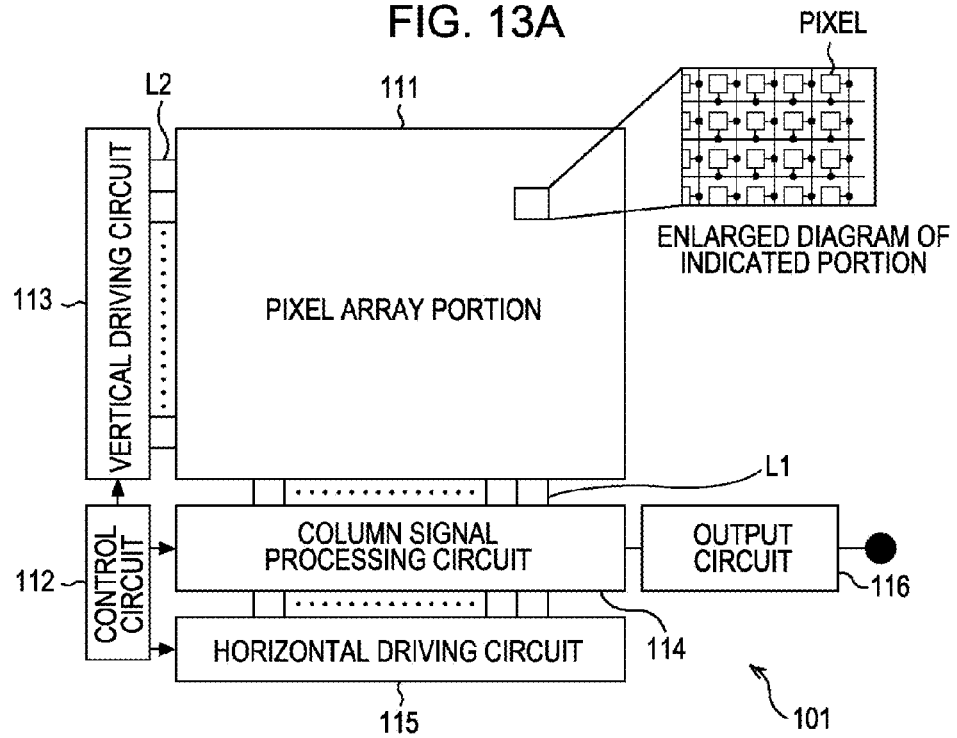
FIGS. 13A and 13B are diagrams illustrating an example of a configuration of an electronic apparatus employing a solid-state imaging device according to an embodiment of the invention.
Figure 13B:
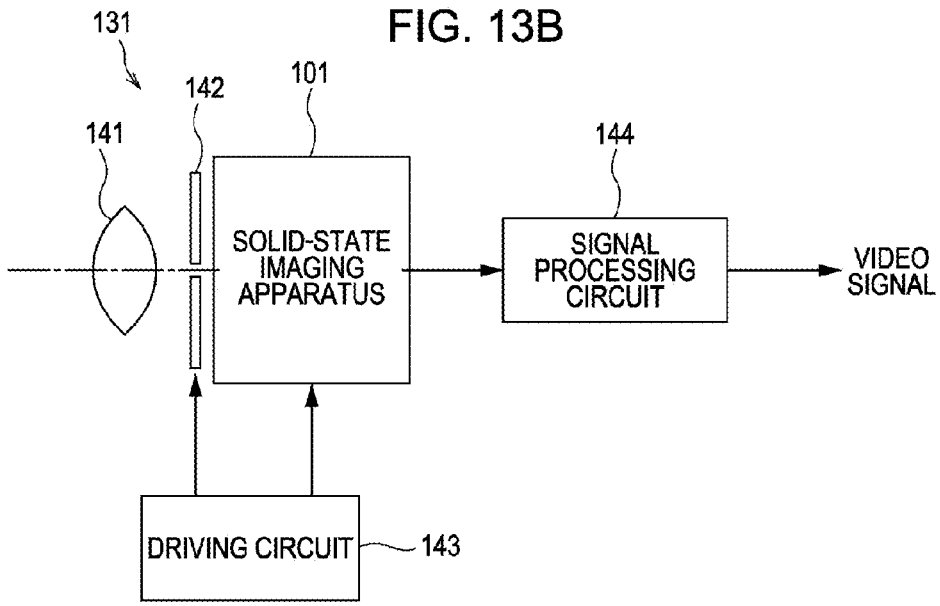

Next, an example of a configuration of an electronic apparatus employing the solid-state imaging device according to the embodiment of the invention is described with reference to FIGS. 13A and 13B. FIG. 13A is a schematic diagram illustrating a configuration of a solid-state imaging apparatus 101 that is constructed with solid-state imaging devices according to the embodiment of the invention. FIG. 13B is a schematic cross-sectional view of an electronic apparatus 131.

As shown in FIG. 13A, the solid-state imaging apparatus 101 includes a pixel array portion 111 where unit pixels are disposed in an array shape, a control circuit 112, a vertical driving circuit 113, a column signal processing circuit 114, a horizontal driving circuit 115, and an output circuit 116. The control circuit 112 controls the vertical driving circuit 113, the column signal processing circuit 114, and the horizontal driving circuit 115. The vertical driving circuit 113, the column signal processing circuit 114, and the horizontal driving circuit 115 transfer pixel signals of the pixel array portion 111 and output the pixel signals from the output circuit 116 by using vertical signal lines L1 and pixel driving lines L2.

The electronic apparatus 131 shown in FIG. 13B is an example of a configuration in the case where the aforementioned solid-state imaging apparatus 101 including pixels according to the embodiment of the invention is used. For example, the electronic apparatus 131 is a digital camera capable of capturing a still image.

The electronic apparatus 131 includes the solid-state imaging apparatus 101, an optical lens 141, a shutter unit 142, a driving circuit 143, and a signal processing circuit 144.

The optical lens 141 allows an image light (incident light) from an object to be focused on an imaging plane of the solid-state imaging apparatus 101. Accordingly, signal charges are accumulated in the solid-state imaging apparatus 101 for a predetermined time interval. The shutter unit 142 controls a light exposure time and a light shutting time for the solid-state imaging apparatus 101. The driving circuit 143 supplies driving signals for controlling the transfer operation of the solid-state imaging apparatus 101 and the shutter operation of the shutter unit 142. The driving circuit 143 supplies driving signals (timing signals) to the solid-state imaging apparatus 101, and the solid-state imaging apparatus 101 performs signal transferring based on the driving signals to supply image signals to the signal processing circuit 144. The signal processing circuit 144 performs various signal processes on the image signals supplied from the solid-state imaging apparatus 101. The signal-processed video signals are stored in a storage medium (not shown) such as a memory or output and displayed on a monitor such as an LCD (liquid crystal display).

The electronic apparatus 131 shown in FIG. 13B employs the solid-state imaging apparatus 101 including the solid-state imaging devices according to the embodiment of the invention. In the floating diffusion of the solid-state imaging apparatus 101, the electric field concentration in the vicinity of the end portion of the transfer gate where the crystal defect is easily generated is prevented, so that it is possible to suppress the leak current. In addition, the overlap capacitance in the end portion of the transfer gate is decreased, so that the conversion efficiency is increased. Therefore, in the electronic apparatus 131, it is possible to capture an image at a high SN ratio.

The electronic apparatus 131 which may be adapted to the solid-state imaging apparatus 101 employing the solid-state imaging device according to the embodiment of the invention is not limited to a digital camera, but it may be adapted to an image capturing apparatus such as a digital still camera or a camera module for a mobile apparatus such as a mobile phone.

According to the embodiment of the invention, in the floating diffusion FD, since the electric field concentration in the vicinity of the end portion of the transfer gate where the crystal defect is easily generated may be prevented, the leak current is suppressed, so that it is possible to capture an image with decreased noise at a low luminance time or a dark time. Particularly, in the case of the solid-state imaging device including a shutter of a global shutter scheme, since the signal charges are stored in the floating diffusion FD up to the reading operation for a long time, the leak current is reduced, and it is possible to capture an image with low noise.

In addition, in the specification, the steps describing the processes may be performed in time series according to the description order, otherwise the steps may be performed in parallel or individually instead of being performed in time series.

The present application contains subject matter related to that disclosed in Japanese Priority Patent Application JP 2009-174329 filed in the Japan Patent Office on Jul. 27, 2009 and JP 2010-065114 filed on Mar. 19, 2010, the entire contents of which are hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A solid-state imaging device comprising:
a substrate;
a photodiode configured to convert an optical signal to signal charges;
a transfer gate on the substrate and configured to transfer the signal charges from the photodiode;
an impurity diffusion layer configured to receive the signal charges from the transfer gate; and
a transistor having a gate connected to the impurity diffusion layer,
wherein,
the impurity diffusion layer has a first conduction type semiconductor layer and a second conduction type semiconductor layer, the first conduction type semiconductor layer and the second conduction type semiconductor layer being impurity regions of the substrate that are (a) opposite conduction types and (b) different in composition from that of the substrate,
the first conduction type semiconductor layer has an uppermost surface exposed at a top surface of the substrate, and
the second conduction type semiconductor layer overlaps the first conduction type semiconductor layer and has a portion disposed under an end portion of the transfer gate.

2. The solid-state imaging device according to claim 1, wherein the first conduction type semiconductor layer and the second conduction type semiconductor layer are in contact with each other.

3. The solid-state imaging device according to claim 1, further comprising an element isolation region, wherein the second conduction type semiconductor layer includes a portion between the element isolation region and the first conduction type semiconductor layer.

4. The solid-state imaging device according to claim 1, further comprising:
a reset transistor; and
a second impurity diffusion layer including a first conduction type semiconductor layer and a second conduction type semiconductor layer,
wherein,
the first conduction type semiconductor layer of the second impurity diffusion layer is a source region of the reset transistor, and
the second conduction type semiconductor layer of the second impurity diffusion region is under an end portion of a reset gate of the reset transistor.

5. The solid-state imaging device according to any one of claims 1 to 3, wherein:
the solid-state imaging device includes a plurality of impurity diffusion layers and a plurality of transfer gates in one pixel, and
each second conduction type semiconductor layer is under the end portion of the respective transfer gate.

6. The solid-state imaging device according to claim 5, wherein in the at least one or more impurity diffusion layers, a surface of each first conduction type semiconductor layer is at least partially covered with the respective second conduction type semiconductor layer.

7. The solid-state imaging device according to claim 1, further comprising:
a plurality of pixels,
wherein,
the solid-state imaging device is of a global shutter scheme where all of the plurality of pixels simultaneously perform image capturing operations, and
all of the plurality of pixels simultaneously perform the transfer of signal charges from a plurality of the photodiodes to a plurality of the impurity diffusion layers so that the signal charges are stored in the plurality of the impurity diffusion layers during a time interval from the transferring to reading.

8. An electronic apparatus comprising a solid-state imaging device, said solid-state imaging device including:
a substrate;
a photodiode configured to convert an optical signal to signal charges;
a transfer gate on the substrate and configured to transfer the signal charges from the photodiode;
an impurity diffusion layer configured to receive the signal charges that are transferred by the transfer gate; and
a transistor having a gate is connected to the impurity diffusion layer,
wherein,
the impurity diffusion layer has a first conduction type semiconductor layer and a second conduction type semiconductor layer, the first conduction type semiconductor layer and the second conduction type semiconductor layer being impurity regions of the substrate that are (a) opposite conduction types and (b) different in composition from that of the substrate,
the first conduction type semiconductor layer has an uppermost surface exposed at a top surface of the substrate, and
the second conduction type semiconductor layer overlaps the first conduction type semiconductor layer and has a portion disposed under an end portion of the transfer gate.

9. The electronic apparatus of claim 8, wherein the first conduction type semiconductor layer is n-type and the second conduction type semiconductor layer is p-type.

10. The electronic apparatus of claim 8, wherein the first conduction type semiconductor layer does not overlap the end portion of the transfer gate.

11. The solid-state imaging device of claim 1, wherein the first conduction type semiconductor layer does not overlap the end portion of the transfer gate.

* * * * *